United States Patent [19]

Deaton et al.

[11] Patent Number: 5,960,555
[45] Date of Patent: Oct. 5, 1999

[54] METHOD AND APPARATUS FOR PURGING THE BACK SIDE OF A SUBSTRATE DURING CHEMICAL VAPOR PROCESSING

[75] Inventors: Paul Deaton, San Jose; Benjamin Bierman, Milpitas; Meredith J. Williams, Santa Clara; Brian Haas, San Jose; David S. Ballance, Cupertino; James V. Tietz, Fremont, all of Calif.

[73] Assignee: Applied Materials, Inc., Santa Clara, Calif.

[21] Appl. No.: 08/858,091

[22] Filed: May 16, 1997

Related U.S. Application Data

[63] Continuation-in-part of application No. 08/687,166, Jul. 24, 1996.

[51] Int. Cl.⁶ .................................................... F26B 11/18
[52] U.S. Cl. ................................................ 34/58; 118/72
[58] Field of Search ................................ 34/58; 118/724, 118/725

[56] References Cited

U.S. PATENT DOCUMENTS

| | | | |
|---|---|---|---|
| 4,651,440 | 3/1987 | Karl | 34/58 |
| 4,677,758 | 7/1987 | Aigo | 34/58 |
| 4,790,262 | 12/1988 | Nakayama et al. | 118/52 |
| 4,989,345 | 2/1991 | Gill, Jr. | 34/58 |
| 4,990,374 | 2/1991 | Keeley et al. | 427/255.1 |
| 5,133,284 | 7/1992 | Thomas et al. | 118/719 |
| 5,230,741 | 7/1993 | van de Ven et al. | 118/728 |
| 5,238,499 | 8/1993 | van de Ven et al. | 118/724 |

FOREIGN PATENT DOCUMENTS

| | | |
|---|---|---|
| 0 456 372 A1 | 11/1991 | European Pat. Off. . |
| 467 623 A2 | 1/1992 | European Pat. Off. . |
| 467 624 A1 | 1/1992 | European Pat. Off. . |
| 0 708 477 A1 | 4/1996 | European Pat. Off. . |
| 0 718 610 A1 | 6/1996 | European Pat. Off. . |
| 40 35 951 C1 | 6/1991 | Germany . |
| 52-1496064 | 12/1977 | Japan . |
| 2 181 458 | 4/1997 | United Kingdom . |
| WO 93/13241 | 7/1993 | WIPO . |

*Primary Examiner*—Ronald Capossela
*Attorney, Agent, or Firm*—Fish & Richardson

[57] ABSTRACT

An apparatus for purging the backside of a substrate in a process chamber includes a purge gas injector. The injector includes a substantially annular-shaped opening providing a slit that is structured and arranged to direct a flow of purge gas about radially outward therefrom in a direction approximately parallel to a plane defined by the substrate, wherein the substrate is supported in the process chamber above the purge gas injector. When the substrate is rotated at a sufficient speed, the purge gas flowing from the injector is impelled to flow spirally outward along the backside of the substrate.

24 Claims, 7 Drawing Sheets

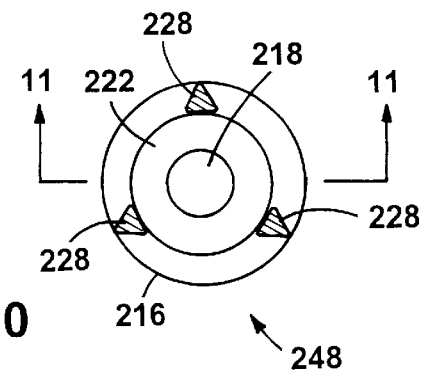
FIG. 10
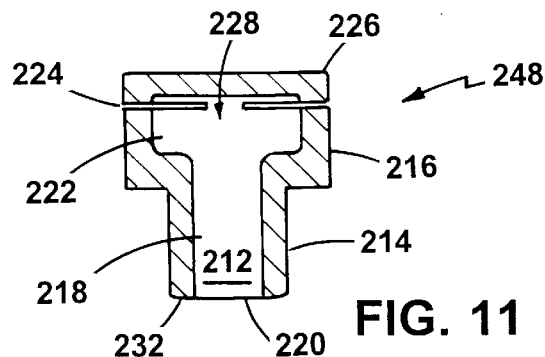
FIG. 11
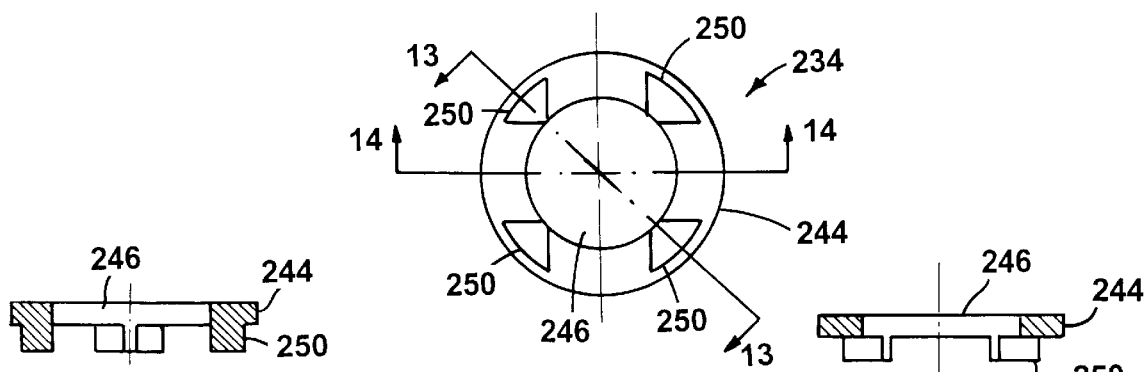
FIG. 13   FIG. 12   FIG. 14

METHOD AND APPARATUS FOR PURGING THE BACK SIDE OF A SUBSTRATE DURING CHEMICAL VAPOR PROCESSING

CROSS REFERENCE TO RELATED APPLICATION

This application is a continuation-in-part of co-owned application Ser. No. 08/687,166, filed Jul. 24, 1996, of same title, by James V. Teitz, et al., and is related to co-owned application Ser. No. 08/687,150, now U.S. Pat. No. 5,781, 693, entitled "Novel way of Introducing Gas into an RTP Chamber", by David S. Ballance, et al., both filed Jul. 24, 1996, and both incorporated herein by reference. This application is also related to co-owned applications Ser. No. 08/858,089, entitled "Reflector Cover For A Semiconductor Processing Chamber," by David S. Ballance, et al., Ser. No. 08/880,194, entitled "Co-Rotating Edge Ring Extension For Use In A Semiconductor Processing Chamber," David S. Ballance, et al., and Ser. No. 08/879,497, entitled "Magnetically-Levitated Rotor System For An RTP Chamber," by Benjamin Bierman, et al., each filed on even date with this application, and each incorporated herein by reference.

BACKGROUND OF THE INVENTION

The invention relates generally to chemical vapor deposition systems, and more particularly to rapid thermal processing (RTP) systems.

Chemical vapor processes for thin film fabrication pass a vapor over a substrate to either grow a film on the substrate, etch the substrate, or otherwise react with a material on the substrate to change the character of the substrate surface. The types of substrates referred to here include wafers for ultra-large scale integrated (ULSI) circuits. The substrate is sometimes subjected to RTP to facilitate or speed vapor processing while minimizing handling. RTP refers to several different processes, including rapid thermal annealing (RTA), rapid thermal cleaning (RTC), rapid thermal chemical vapor deposition (RTCVD), rapid thermal oxidation (RTO), and rapid thermal nitridation (RTN).

In one RTP process, wafers are loaded into a processing chamber at room temperature to several hundred degrees Celsius in a nitrogen ($N_2$) gas ambient atmosphere. The temperature of the wafer is ramped to a process temperature, usually in the range of about 600° C. to 1200° C. The temperature is raised using a large number of halogen lamps which radiatively heat the wafer. The temperature stabilizes over a pre-set time period, and reactive gases are introduced. The gas may be introduced while ramping the temperature. For example, oxygen may be introduced for growing a layer of silicon dioxide ($SiO_2$).

The wafer is sometimes supported around the periphery of its bottom side on an annular-shaped ledge of a supporting edge ring. The wafer's peripheral edge is left exposed. Gaseous products of the chemical reactions on the wafer are expected to be exhausted via a pumping system. In such a system, the reactive gases can spill over the edge of the wafer and edge ring, or may leak to the region below the wafer due to imperfections in the edge ring supporting the wafer or due to incomplete coverage of the edge ring by the wafer. The spilled-over process gasses can deposit a non-uniform film on the peripheral edge of the wafer, on its backside, or on components located below the wafer. The presence of hot gases in these regions can also cause damage and corrosion. Accumulated deposits may also flake off, contaminating the process chamber with particles. Also, non-uniform depositions around the edge of the wafer are undesirable for subsequent wafer processing.

One approach to inhibit the process gases from depositing on the edge or backside is to use an edge ring that covers a portion of the upper surface of the wafer. Another approach is to coat the entire backside of the wafer uniformly to produce a more stable film less likely to flake. To this end, the wafer is supported on pins so that the process gases can easily deposit on the backside.

In those cases where depositing on the backside is undesirable, one or another of a variety of edge-specific purges with inert gases are used to prevent reactive gases from reaching the edge and backside areas. One type of such a system uses a susceptor with built-in channels for directing purge gas flows to the edge of the wafer.

Current schemes for providing effective edge purging may incompletely isolate the backside from reactive gases if the flow of purge gas is too weak. If the purge gas is flowed more strongly, it can spill over the front side of the wafer and mix with the process gas at the periphery of the wafer by diffusion or by convection. The resulting dilution of reactive gases over the front side of the wafer leads to incomplete film deposition near the periphery of the front side, thereby reducing the usable area having a uniform film on the wafer.

The uniformity of the process over the surface of the substrate during thermal processing is also critical to producing uniform devices. For example, in the particular application of complementary metal-oxide-semiconductor (CMOS) gate dielectric formation by RTO or RTN, thickness, growth temperature, and uniformity of the gate dielectrics are critical parameters that influence the overall device performance and fabrication yield. Currently, CMOS devices are being made with dielectric layers that are only 60–80 Angstroms ($10^{-10}$ m) thick and for which thickness uniformity must be held within ±2 Å. This level of uniformity requires that temperature variations across the substrate during high temperature processing cannot exceed a few degrees Celsius. Temperature uniformity provides uniform process variables on the substrate (e.g., layer thickness, resistivity, etch depth) for process steps including film deposition, oxide growth and etching. In addition, temperature uniformity across the substrate is necessary to prevent thermal stress-induced wafer damage such as warpage, defect generation and slip. This type of thermal stress is caused by thermal gradients which are minimized by temperature uniformity. The wafer often cannot tolerate even small temperature differentials during high temperature processing. Therefore, any viable purge scheme should not adversely affect temperature uniformity during processing.

SUMMARY OF THE INVENTION

The invention provides a system for purging the backside of the wafer, including an improved purge gas injector. A processing system according to the invention includes a process chamber and a support assembly within the process chamber being structured and arranged to support a substrate. The processing system may further include a heat source positioned above the substrate for thermal processing the substrate. A purge gas injector is positioned below a backside of the substrate when the substrate is supported from the support assembly. The purge gas injector includes a substantially annular-shaped opening providing a slit. The slit is structured and arranged to direct a flow of purge gas about radially outward therefrom in a direction approximately parallel to a plane defined by the substrate.

The injector can include a body having an upward extending channel, a top plate, and support structure positioning the top plate above the body, wherein the slit is provided between the body and the top plate with the channel opening to the slit. The body and top plate can be fabricated of transparent quartz. The body may further include an upper part, which includes the slit and the top plate, being of a first diameter, and a lower part being of a second diameter that is smaller than the first diameter. The channel may include an upper channel portion within the upper part of the body, and a lower channel portion connecting between the upper channel portion and an opening at a bottom end of the channel that couples to a source of purge gas.

The support assembly can include a quartz cylinder and an edge ring for supporting the substrate, wherein the cylinder supports the edge ring. The process chamber can include a reflector plate positioned below the substrate, wherein a thermal cavity is provided by the reflector plate, the quartz cylinder, the edge ring and the substrate. The reflector plate includes an opening through which the purge gas injector protrudes into the thermal cavity. The quartz cylinder and the reflector plate can provide a gap therebetween for the purge gas to flow out from the thermal cavity.

The injector's annular-shaped opening can be positioned off of a central axis of the substrate, for example, closer to the central axis than to a peripheral edge of the substrate.

The chamber may include a rotation mechanism to rotate the support assembly and the substrate about a central axis of the substrate while the purge gas is flowing from the purge gas injector. The rotation mechanism can be adapted to rotate the support assembly at a rate sufficient to impel the flow of purge gas to flow spirally outward along the backside of said substrate, for example, at a rate of at least about 30 RPM.

The invention also provides a method for processing a substrate, including supporting the substrate within a process chamber such that a backside of the substrate is substantially exposed, and flowing a purge gas in a substantially outwardly radial direction from a substantially annular-shaped slit of an injector positioned below the backside of the substrate. The method may further include rotating the substrate at a rotation speed sufficient to cause the flowing purge gas to be impelled by the substrate backside in an outward spiralling direction along the backside. The method may also include heating the substrate, and flowing a process gas on a front side of the substrate.

The method can additionally include positioning the slit of the injector within a thermal cavity between a reflector plate and the substrate, and laterally off of a central axis of the substrate. A support cylinder can provide a side wall of the thermal cavity. With this arrangement, the method can further include causing the purge gas to flow downward along the side wall when the spirally flowing purge gas reaches a periphery of the substrate, and then to flow out of the thermal cavity through a gap provided between the cylinder and the reflector.

According to yet another aspect of the invention, a method of processing a disk-shaped substrate in a process chamber, includes supporting the substrate from a peripheral edge on a rotation assembly, flowing a purge gas approximately radially outward from an injector positioned below the substrate, the purge gas flowing from the injector flowing approximately parallel to the substrate, and rotating the substrate with the rotation assembly at a speed sufficient to cause the purge gas to spiral outward along a backside of the substrate towards the peripheral edge.

The invention further provides an apparatus in a vapor processing system which includes a process chamber. The apparatus includes a rotatable support assembly structured and arranged to support a substrate within the process chamber. The support assembly is capable of rotating the substrate about a central axis at a rotational speed of at least approximately 90 RPM when coupled to an actuator. A conduit is structured and arranged to direct a flow of purge gas over a backside of the substrate while the substrate is rotating such that the rotating substrate causes the purge gas to flow radially outward relative to the substrate.

The apparatus may further include a process gas conduit structured and arranged to direct a flow of process gas over a front side of the substrate while the substrate is rotated such that the rotating substrate causes the process gas to flow radially outward relative to the substrate. The support assembly may include an edge ring supporting the substrate. Confronting surfaces of the edge ring and the substrate can be structured and arranged to channel the radially flowing purge gas around a peripheral edge of the substrate.

According to another aspect of the invention, a system to process a substrate includes a process chamber, an edge ring to support the substrate within the process chamber, and a rotation assembly structured and arranged to rotatably couple the edge ring to an actuator located outside the process chamber. The process chamber includes a process gas conduit structured and arranged to flow a process gas over a front side of the substrate, and a purge gas conduit structured and arranged to flow a purge gas over a backside of the substrate while the substrate is rotated. The process chamber can include a heat source positioned above the substrate for thermal processing the substrate. The bottom of the process chamber, the rotation assembly, the edge ring and the substrate can cooperatively form a thermal cavity.

The rotation assembly can include a cylinder supporting the edge ring. The cylinder is supported by an upper bearing race which is rotatably coupled to a stationary lower bearing race by bearings therebetween. The upper bearing race is structured and arranged to be magnetically coupled to the actuator for rotating the upper bearing race and the cylinder. The rotation assembly can be structured and arranged to rotate the substrate about a central axis at a rotational speed of at least approximately 90 RPM.

The edge ring may include an annular ledge having an upper surface to support the backside of the substrate near a peripheral edge of the substrate. The ledge is structured and arranged to allow passage of outwardly flowing purge gas past the peripheral edge.

The purge gas conduit may include an injector which includes a slit through which the purge gas flows. The slit is disposed parallel to a plane defined by the substrate when the substrate is supported by the edge ring.

The invention also provides a method of purging a backside of a substrate with a purge gas, such as, for example, an inert gas. The method includes the steps of rotating the substrate about a central axis, for example, at a rotational speed of at least approximately 90 RPM, and flowing the purge gas over the backside of the rotating substrate. The rotating substrate urges the purge gas to flow in an outward radial direction relative to the rotating substrate. The purge gas can be flowed through an aperture in a plate spaced from the backside of the substrate.

The method may also include the step of flowing a process gas over a front side of the rotating substrate, wherein the rotating substrate urges the process gas to flow in the outward radial direction. The substrate may be heated while flowing the process gas.

The method can further include channelling the radially flowing purge gas past a peripheral edge of the rotating substrate. The channelling may include channelling the radially flowing purge gas through a plurality of flow paths that are provided by confronting surfaces of the substrate and an edge ring supporting the substrate. The channelling can also include directing the radially flowing purge gas in a generally axial direction near a peripheral edge of the substrate. Rotating the substrate can include rotating the substrate on a rotating edge ring, an outer annular surface of the edge ring further urging the channeled purge gas and the outwardly flowing process gas to flow radially outward therefrom.

The invention also provides a method of vapor processing a disk-shaped substrate in a process chamber, including the steps of supporting the substrate on a rotation assembly, the rotation assembly including an edge ring having an inner annular ledge supporting the substrate near the substrate's peripheral edge; flowing a purge gas over a backside of the substrate; flowing a process gas over a front side of the substrate; and rotating the substrate with the rotation assembly to urge the purge gas and the process gas radially outward toward the substrate's peripheral edge. The substrate can be heated while rotating the substrate. The substrate can be rotated at a rotational speed of at least approximately 90 rpm.

The present invention provides an apparatus and method for flowing a purge gas across the backside of a wafer in an RTP chamber that inhibits the formation of unwanted deposits. The apparatus and method inject the purge gas in a pattern that minimally affects the temperature of the wafer. The apparatus and method also cause minimal interference with a pyrometric temperature measurement of the backside of the wafer. The apparatus and method further inhibit the inflow of reactant gases onto sensitive components of the process chamber outside of a processing region.

Other advantages and features of the present invention will become apparent from the following description, including the drawings and claims.

BRIEF DESCRIPTION OF THE DRAWINGS

FIG. 10 is a cross-sectional view along line 10—10 of the purge gas injector illustrated in FIG. 9;

FIG. 11 is a cross-sectional view through line 11—11 of FIG. 10;

FIG. 12 is a bottom plan view of a stand-off that is adapted to allow purge gas to pass through the purge gas injector illustrated in FIGS. 9–11;

FIG. 13 is a cross-sectional view along line 13—13 of FIG. 12; and

FIG. 14 is a cross-sectional view along line 14—14 of FIG. 12.

The same structures illustrated in different figures are referred to with the same reference numerals.

DETAILED DESCRIPTION OF THE INVENTION

The present invention relates to a purge gas injector for use in thermochemical processing chambers and methods for purging the backside of a substrate during a thermochemical process. One type of RTP apparatus is disclosed in U.S. patent application Ser. No. 08/359,302, filed Dec. 19, 1994, entitled "A Method And Apparatus For Measuring Substrate Temperatures," assigned to the assignee of the present invention, and hereby incorporated by reference. The purge gas injector is positioned within a cylindrically-shaped thermal cavity located below the backside of a wafer. A rotating support for the wafer spins the wafer to draw the purge gas up to the backside of the wafer in an expanding spiral-shaped flow. In one of the embodiments described below, the injector flows purge gas approximately radially outward in a direction about parallel to the plane of the wafer between the wafer and a reflector at the bottom of the cavity. Also described below is an embodiment wherein the purge gas flows out of the thermal cavity through a narrow annular-shaped gap located between the cylindrical wall of the rotating support and the rim of the reflector.

Figure 1:
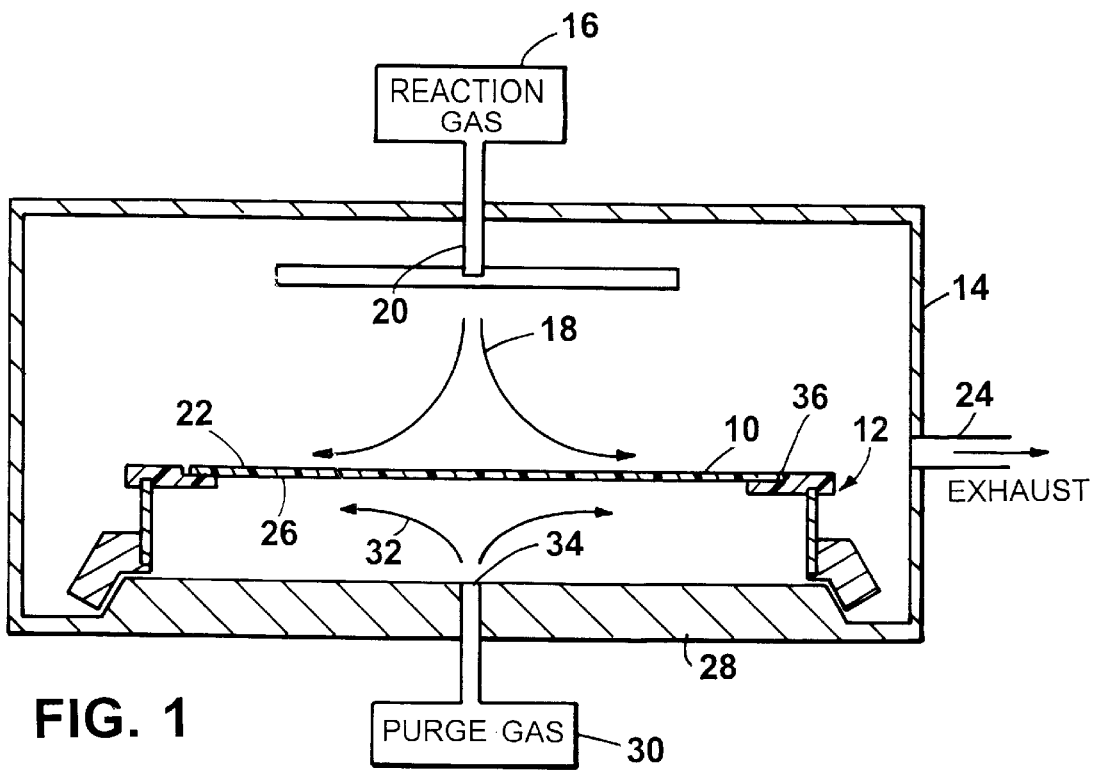
FIG. 1 is a diagrammatic cross-sectional side view of a vapor processing system that uses rotational backside purging.

Referring to FIG. 1, a vapor processing system that purges a backside of a substrate 10 includes a rotatable support structure 12 mounted in a process chamber 14. A reaction gas supply 16 provides a regulated flow of a reaction gas 18 that is directed through apertures formed in a shower-head type nozzle 20 to a front surface 22 of substrate 10. Gases are removed through exhaust 24. The bottom 28 of chamber 14, the support structure 12, and the backside 26 of substrate 10 together define a cavity. A purge gas supply 30 provides a regulated flow of non-reactive purge gas 32 that is directed through an injector 34 in the bottom 28 of chamber 14.

When the front and back surfaces 22, 26 rotate, they impart an outward radial momentum to the reaction gas 18 and the purge gas 32, respectively. At sufficiently high rotational speeds, the interaction of the substrate surfaces 22, 26 with the gases 18, 32 causes the gases to flow in an outwardly radial direction toward the peripheral edge 36 of substrate 10.

Referring now also to FIGS. 2(a) and (b), the substrate 10 rests on an inner annular ledge 38 of an edge ring 40. In this embodiment, ledge 38 is flat so that when the substrate 10 is resting on it, the flow of purge gas in a gap 41 that may be located between the backside of the substrate and the annular ledge 38 is significantly restricted. This produces a higher velocity of any purge gas which does manage to flow through region 41, thereby also producing a more effective barrier to process gas flowing back through region 41 into the region behind the wafer.

An upper surface 42 of an outer annular portion 44 of the edge ring 40 is approximately level with the upper surface 22 of the substrate 10. Under some circumstances, it may be undesirable to have an upward step or a downward step that could disturb the smooth outward flow of process and purge gases. Also a downward step could allow process gases to interact more easily with the peripheral edge of the substrate. The interaction of the gases 18 and 32 with the rotating substrate upper surface 22 and outer annular portion upper surface 42 transfers additional outward radial momentum to the gases. Both gases 18 and 32 move radially outward and away from the upper surface 22 of the substrate 10.

The outward radial flow inhibits significant mixing of the purge gas 32 with the reaction gas 18 over the substrate upper surface 22. This helps to achieve a more uniform process profile out to the periphery of the upper surface 22 of the substrate 10. The flowing purge gas 32 prevents the reaction gas 18 from migrating over the peripheral edge 36 of the substrate, and thereby helps to prevent the reaction gas 18 from depositing an unwanted film on the edge 36 or the back surface 26 of the substrate 10.

Figure 3A:
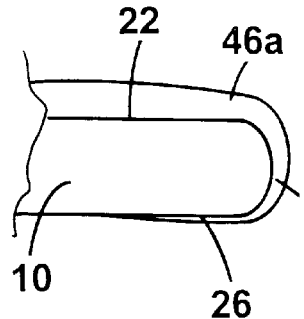
FIGS. 3(a)–(c) schematically illustrate deposition profiles near the peripheral edge of a wafer under different conditions.

A film 46a produced on a wafer substrate 10 without a flow of a purge gas and/or without rotating the wafer 10 is schematically illustrated in FIG. 3(a). The film 46a extends onto the peripheral edge 36 of the wafer 10 and around onto the backside 26. These areas of the film are typically thinner than the film produced on the upper surface 22 of the wafer 10. The film 46a can easily flake off from these regions, thereby contaminating the processing system.

Figure 3B:
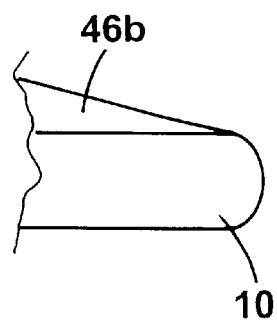

FIG. 3(b) shows a second film 46b produced by flowing purge gas 32 during the deposition process, but without rotating the wafer 10 at speeds sufficient to cause an outward radial flow of the purge gas 32 or process gas 18. In this case, the film 46b has a reduced profile, or thickness, near the edge 36 of the wafer 10, thereby reducing the usable area of the upper surface of the wafer.

Figure 3C:
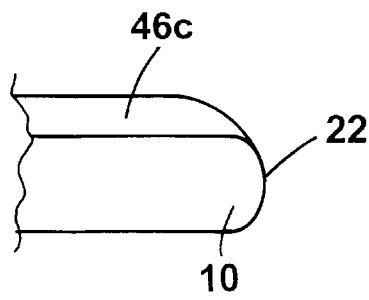

FIG. 3(c) schematically illustrates a third film 46c produced by flowing purge gas 32 during the deposition process and by rotating the wafer 10 at speeds sufficient to cause an outward radial flow of the purge gas 32 and process gas 18. Film 46c has a more uniform profile near the edge 36 of the wafer 10, and does not extend around the edge 36.

Figure 4:
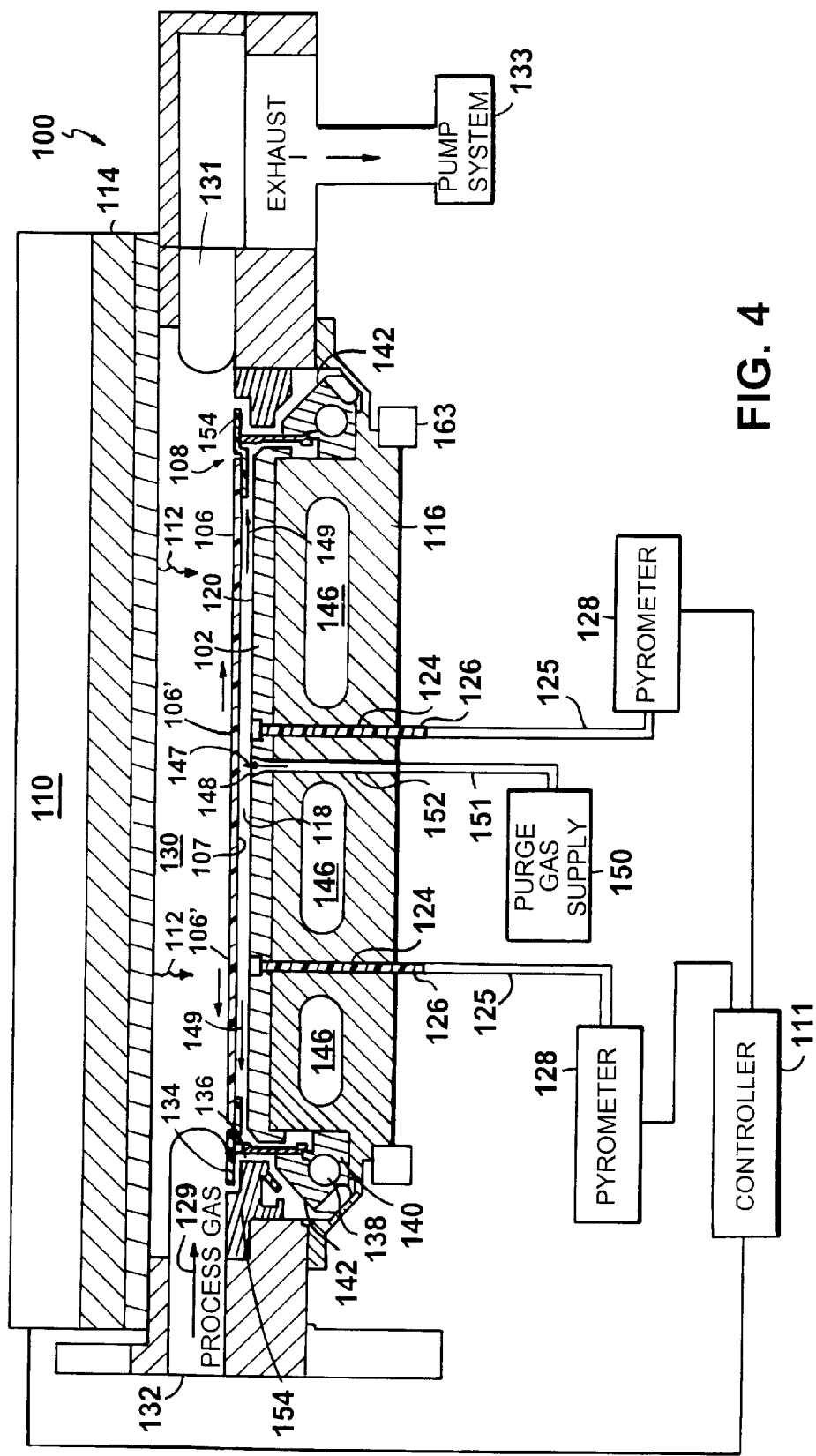
FIG. 4 is a cross-sectional side view of an RTP system embodying the invention.

A system that has been modified in accordance with the invention is shown in FIG. 4. In particular, FIG. 4 shows a processing chamber 100 for processing a disk-shaped, twelve-inch (300 millimeter (mm)) diameter silicon (Si) substrate 106. The substrate 106 is mounted inside chamber 100 on a substrate support structure 108 and is heated by a heating element 110 located directly above substrate 106. Heating element 110 generates radiation 112 which enters processing chamber 100 through a water-cooled quartz window assembly 114 which may be approximately 25 mm above the substrate. Beneath substrate 106 is a reflector 102 which is mounted on a central assembly 116 having a generally cylindrical base. Reflector 102 may be made of aluminum and may have a highly reflective surface coating 120. An underside or backside 107 of substrate 106 and the top of reflector 102 form a reflecting cavity 118 for enhancing the effective emissivity of substrate 106.

The separation between substrate 106 and reflector 102 can be varied. In processing systems that are designed for twelve-inch silicon wafers, the distance between substrate 106 and reflector 102 may typically be between about 3 mm and 20 mm.

The temperatures at localized regions 106' of substrate 106 are measured by a plurality of temperature probes. The described embodiment actually uses eight measurement probes radially distributed over the reflector 102 so as to measure the temperature at different radii of the substrate 106; however, only two probes are shown in FIG. 4. The temperature probes include sapphire light pipes 126, which may be inserted into conduits 124 that pass from the backside of central assembly 116 through the top of reflector 102. Sapphire light pipes 126 are about 0.080 inch in diameter and conduits 124 are slightly larger to enable the light pipes to be easily inserted into the conduits. Light pipes 126 are connected to pyrometers 128 via fiber optics 125. Pyrometers 128 produce signals indicative of the measured temperature in a known manner.

A processing region 130 is located generally above substrate 106. In processing region 130, and to a certain extent in other areas of the chamber, process gases are used in conjunction with the temperature control of substrate 106 via lamps 110 to conduct chemical reactions on substrate 106. These reactions include, but are not limited to, oxidation, nitridation, film growth, etc. The process gases 129 typically emerge into processing region 130 through a gas plenum or showerhead (see, also, FIG. 1) located above or to the side of processing region 130. In the embodiment shown in FIG. 4, these gases enter from a side gas inlet 132. Certain details of such processes and devices causing the same are described in U.S. Pat. No. 5,155,336, filed Oct. 24, 1991, owned by the assignee of the present invention, and hereby incorporated by reference, and in the aforementioned co-owned patent application entitled "Novel Way of Introducing Gas into an RTP Chamber". If necessary, process gases may be pumped out of the chamber or exhausted by a pumping system 133 of known design through an exhaust port 131.

Substrate 106 is generally a large diameter silicon wafer. Wafers of other materials may also be used. The diameter of substrate 106 is often at least 200 mm, but substrates of any size may be accommodated by the present invention.

A suitable heating element 110 is disclosed in above mentioned U.S. Pat. No. 5,155,336. This heating element uses a number of light pipes to deliver highly collimated radiation from tungsten-halogen lamps to processing chamber 100. The lamps may be divided into twenty-four zones which are located in a radially symmetrical manner. The zones can be individually adjusted by a controller 111 having a feedback system, based on the signals received from pyrometers 128, to allow the radiative heating of different areas of substrate 106 to be controlled.

Central assembly 116 includes a circulation circuit including chambers 146 through which coolant such as a cooled gas or liquid circulates, thereby cooling reflector 102. Water which is typically at about 23° C. may be circulated through central assembly 116 to keep the temperature of reflector 102 well below that of heated substrate 106 (e.g., 150° C. or less).

During thermal processing, support structure 108 can be rotated at speeds of at least about 90 RPM. Thus, each probe actually samples the temperature profile of a corresponding annular ring area on the substrate. As shown in FIG. 4, the support structure which rotates the substrate includes an edge ring 134 which contacts substrate 106 around the substrate's outer perimeter, thereby leaving all of backside 107 of substrate 106 exposed except for a small annular region about the outer perimeter. Edge ring 134 may have a radial width of approximately 0.75 inch (18 mm) to approximately 1.0 inch (2.5 mm). To minimize the thermal discontinuities that will occur at the edge of substrate 106 during processing, edge ring 134 is made of the same, or similar, material as substrate 106, e.g. silicon or silicon carbide.

Edge ring 134 rests on a rotatable tubular quartz cylinder 136 that is coated with silicon to render it opaque in the frequency range of the pyrometers 128. The silicon coating on quartz cylinder 136 acts as a baffle to block out radiation from external sources that might contaminate the intensity measurements. The bottom of quartz cylinder 136 is held by an annular upper bearing race 142 which rests on a plurality of ball bearings 138 that are, in turn, held within an stationary, annular, lower bearing race 140. Ball bearings 138 can be made of silicon nitride to reduce particulate formation during operation. Upper bearing race 142 is magnetically-coupled to an actuator (not shown) which rotates cylinder 136, edge ring 134 and substrate 106 at an operating speed during thermal processing.

The substrate 106 and support assembly 108 may also be rotated by a magnetic levitation system or other known apparatuses. One way of accomplishing the rotation is described in a U.S. Patent Application entitled "Magnetically-Levitated Rotor System for an RTP Chamber" filed on even date herewith, assigned to the assignee of the present application and incorporated herein by reference.

A purge gas 147 is provided to cavity 118 through a purge gas injector 148 located between backside 107 of substrate 106 and reflector 102. Purge gas injector 148, which will be described in greater detail below, is connected to a regulated purge gas supply 150 through a passageway 152 extending through central assembly 116 and via a conduit 151.

In the embodiment described with reference to FIG. 4, injector 148 is approximately centered in reflector 102 and directs a flow of a purge gas 147 into a central area of cavity 118. Injector 148 directs purge gas, on average, approximately normal to the surface 106.

We have observed that rotating the substrate 106 with rotation speeds as low as about 20 RPM impels the purge gas 147 introduced through injector 148 in an outward radial direction, indicated with arrows 149. Positive results are produced with rotation speeds of 30–40 RPM and higher.

In another embodiment, injector 148 can be structured to direct purge gas 147 upward and radially outward in a conical-shaped flow pattern. In yet another embodiment, which will be described in greater detail below, an injector directs the purge gas in a substantially radial direction, with substantially no component directed normal to the plane of the substrate 106. Of course, it should be understood that other devices for introducing backside purge gas 147 in a way that is compatible with this invention are readily implemented by persons skilled in the art.

Cylinder 136 can be structured to form passages for purge gas 147 to flow out of cavity 118 into the annular region between edge ring 134, cylinder 136 and shield ring 154.

Figure 6:
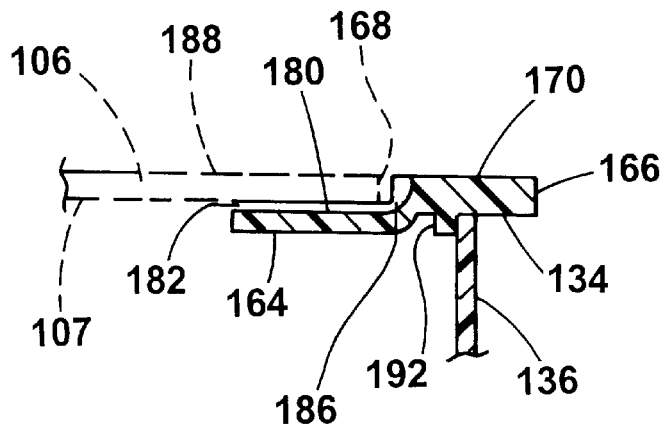
FIG. 6 is a sectional view along lines 6—6 of FIG. 5, with a substrate shown in shadow.
Figure 5:
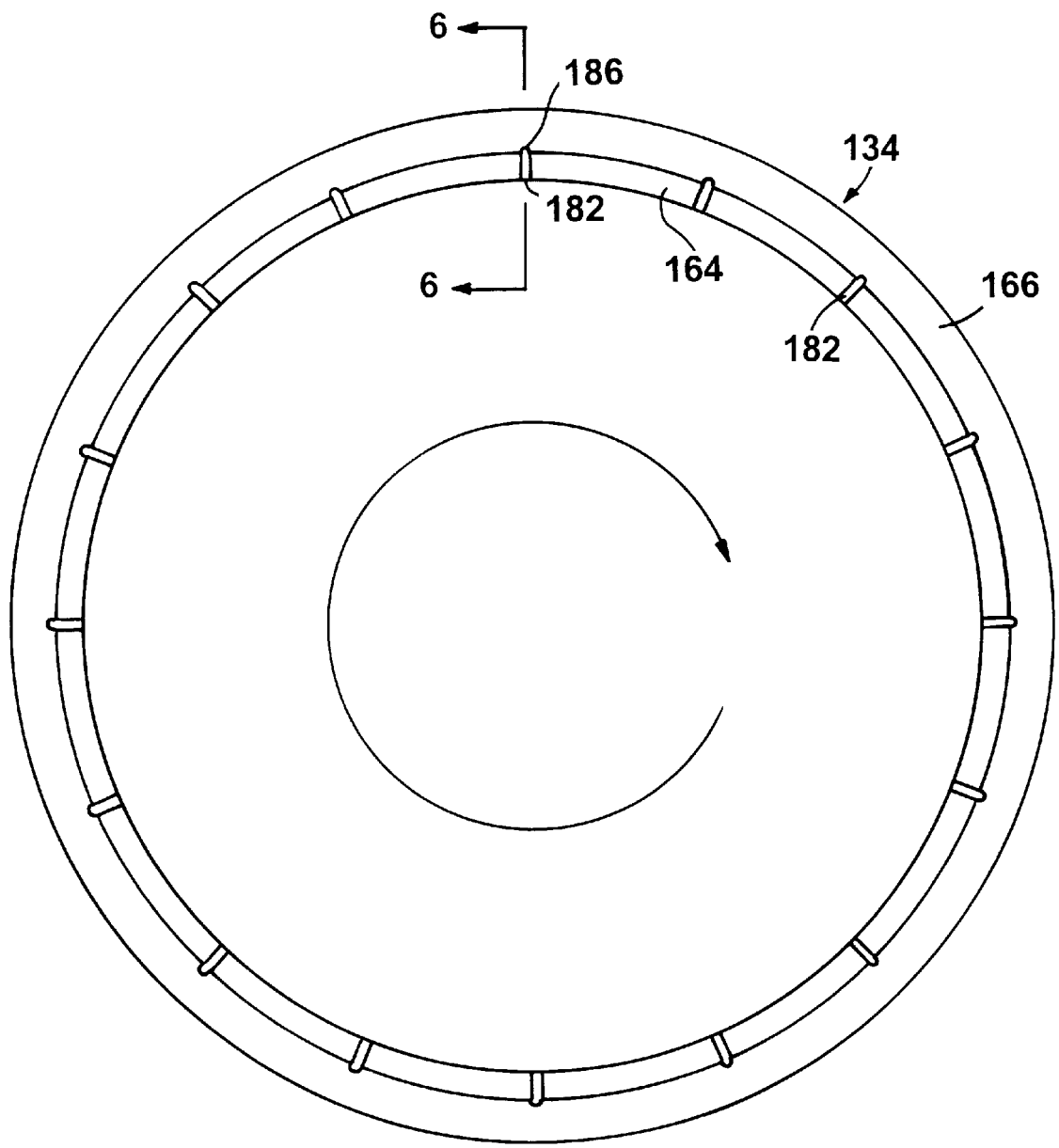
FIG. 5 is a plan view of an edge ring.

Referring now to FIGS. 5 and 6, edge ring 134 has an inner portion forming a ledge 164 that supports substrate 106 and an outer portion 166 that is supported by cylinder 136. In the above-described embodiment, the surface of ledge 164 is flat so as to create a good seal when contacted by the backside of the wafer. In this alternative embodiment, however, grooves 182 are formed in the upper surface 180 of ledge 164. The grooves extend in an approximately radial direction from the inner edge of the ledge 164, partially into the outer portion 166. The grooves 182 provide flow paths that allow the purge gas 147 to more easily flow between the substrate 106 and the supporting ledge 164 of edge ring 134. The outermost portions of grooves 182 include an arcuate upward bend 186 that redirects the flow of purge gas 147 past the peripheral edge 168 of substrate 106 upward and outward in a more axially directed flow.

While sixteen grooves 182 are illustrated in FIG. 5, a smaller number of grooves may also be utilized. A greater number of grooves more closely spaced together around the ring may provide a more uniform outward radial flow of purge gas.

The upper surface 170 at the outer portion 166 of edge ring 134 is at an elevation approximately the same as the upper surface 188 of substrate 106.

Figure 8:
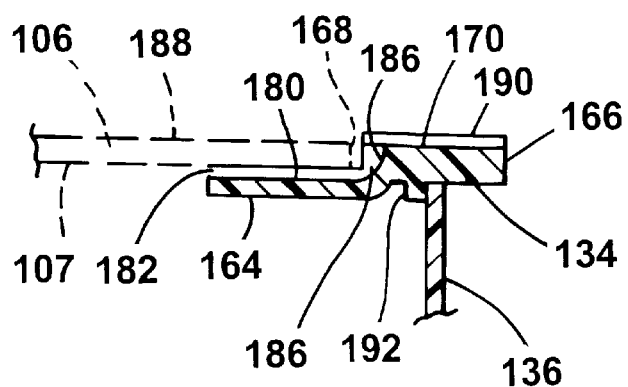
FIG. 8 is a sectional view along lines 8—8 of FIG. 7, with a substrate shown in shadow.
Figure 7:
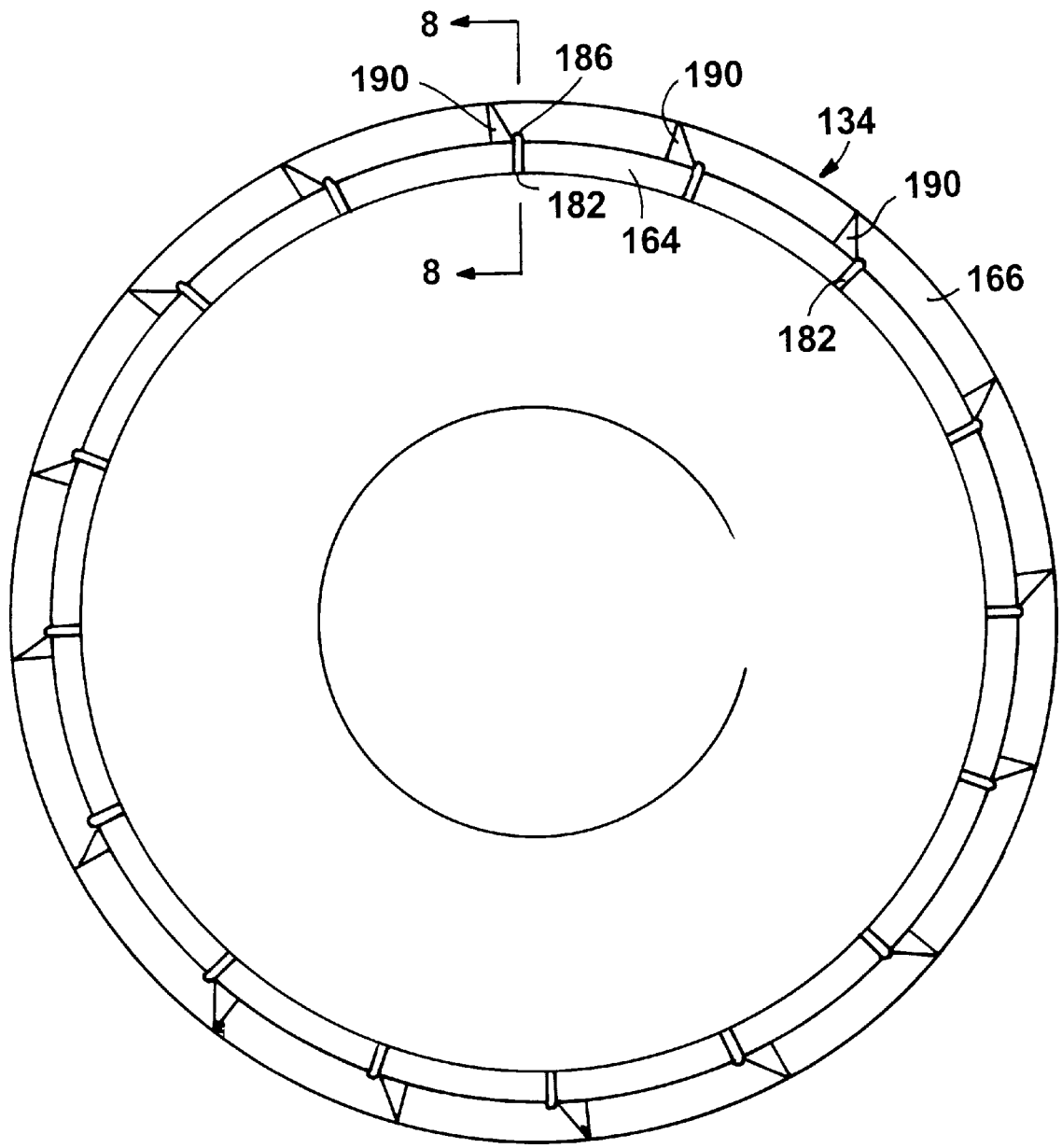
FIG. 7 is a plan view of another embodiment of an edge ring.

In another embodiment, illustrated in FIGS. 7 and 8, the upper surface 170 includes elevated ridges or vanes 190 structured to assist in moving the purge gas 147 and the process gas 129 outward and away from the edge ring 134. Each vane 190 is located adjacent an upward bend 186 of an associated one of grooves 182.

The edge ring 134 is also designed to create a light-tight seal with the quartz cylinder 136. Extending from the bottom surface of the edge ring 134 is a cylindrically-shaped lip 192 which has an outside diameter that is slightly smaller than the inside diameter of the quartz cylinder 136, so that it fits into the cylinder, as shown, and forms a light seal. Alternatively, lip 192 can be a larger diameter to form a light seal with the outer surface of cylinder 136.

Edge ring 134 has an outer radius that is larger than the radius of the quartz cylinder 136 so that it extends out beyond the quartz cylinder. The annular extension of the edge ring 134 beyond cylinder 136, in cooperation with shield ring 154 located below it, functions as a baffle which prevents stray light from entering the reflecting cavity 118. To further reduce the possibility of stray light reflecting into the reflecting cavity 118, edge ring 134 and shield ring 154 may also be coated with a material that absorbs the radiation generated by heating element 110 (e.g., a black or grey material).

The purge gas can be an inert gas, e.g., argon, or a non-reactive gas, e.g. $N_2$, although other types of gases can also be used. The choice of gas depends upon the particular material used in the chamber and upon the process being performed in the chamber. For example, under some circumstances it may be desirable to use a purge gas that will react with the source gas to scavenge possible deposition material, e.g., $H_2$ or HCl.

Figure 9:
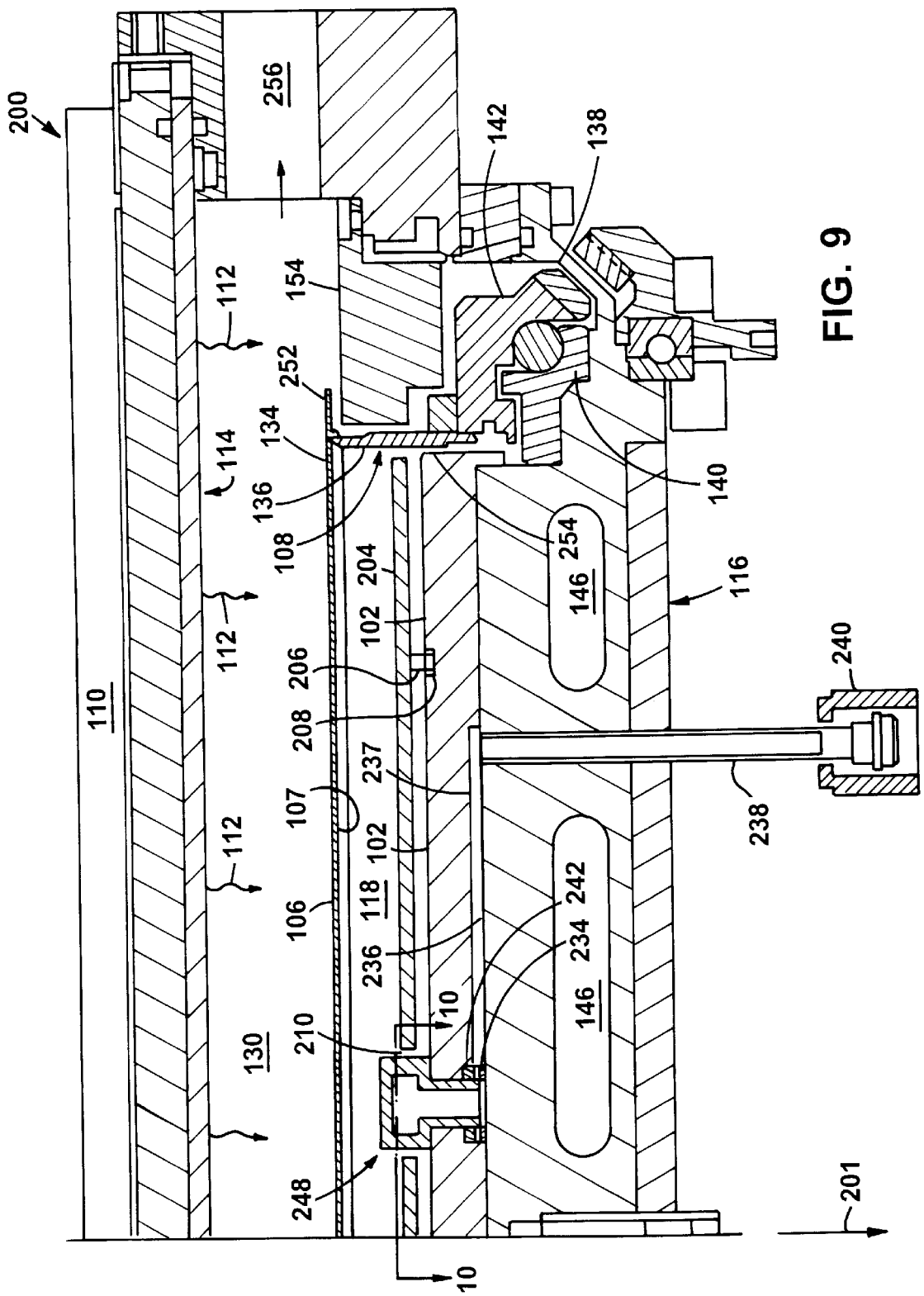
FIG. 9 is a cross-sectional side view of a portion of another embodiment of an RTP system with a purge gas injector according to the invention.

A particularly effective embodiment of an injector 248 for introducing the purge gas is shown in a modified RTP chamber 200 in FIG. 9. Only one-half of process chamber 200 to one side of a central axis 201 of thermal cavity 118 is shown to allow greater detail of illustration of purge gas injector 248. This sectional view also does not show light pipes 126, pyrometers 128 or heater controller 111. Note that injector 248 is positioned off of thermal cavity's central axis 201, and therefore off the substrate's 106 central axis.

RTP chamber 200, like the chamber 100 described above with reference to FIG. 4, includes a rotatable substrate support structure 108 and a heating element 110 located to direct heat radiation 112 onto the substrate 106. A reflecting cavity 118 is formed by substrate 106, reflector 102, edge ring 134, and cylinder 136. A processing region 130 is located between substrate 106 and heater window assembly 114. A rotation mechanism is adapted to rotate the support structure 108.

RTP chamber 200 also includes a transparent quartz reflector cover 204, which is located between reflector 102 and substrate 106. Reflector cover 204 is described in detail in co-owned application Ser. No. 08/858,089, entitled "Reflector Cover For A Semiconductor Processing Chamber," filed on even date, the entire disclosure of which is incorporated herein by reference. Cover 204 is supported above reflector 102 by a plurality of supports, which may connect to reflector 102 or to other parts of the chamber. In the embodiment illustrated in FIG. 9, support for cover 204 is provided by cylindrical posts 206 that rest in slightly larger diameter cylindrical hollows 208 formed in reflector 102. It will be recognized that posts 206 may be replaced by numerous other types of coupling structures including rings, pins, suspensions, etc. In the described embodiment, four posts 206 are provided for supporting reflector cover 204, of which only one is shown in FIG. 9.

In a system for processing 300 mm wafers, in which reflector 102 may be approximately 18 mm below substrate 106, cover 204 may be approximately 2–3 mm thick and may be positioned a distance approximately 2–3 mm above reflector 102 and a distance approximately 10 mm below the bottom surface of substrate 106. These distances are chosen in part to balance the thermal load on cover 204. In this way, the temperature of cover 204 is maintained such that a minimum of deposition occurs on cover 204 or on reflector 102 below it.

Injector 248 extends up from reflector plate 102 through an aperture 210 formed in cover 204. Referring now also to FIGS. 10 and 11, injector 248 may be machined, for example, from an approximately mushroom-shaped, transparent quartz plug that has been formed with a central channel 212 by well known methods. Instead of being made of a transparent material, injector 248 can also be made of a highly-reflective material, such as, for example, a gold plated metal. Injector 248 has a cylindrical bottom 214 and a larger diameter cylindrical top 216.

Central channel 212 includes a cylindrical-shaped lower channel 218 that extends from an aperture 220 in bottom 214, through bottom 214, and into top 216. Lower channel 218 connects to a larger diameter upper channel 222 within top 216. A radially extending slit 224 communicating with upper channel 222 extends substantially 360° around top 216. A top plate 226 is supported by small, approximately triangular-shaped posts 228 that remain after cutting slit 224 with a slitting saw. In the embodiment illustrated in FIGS. 10 and 11, there are three evenly-spaced posts 228 that divide slit 224 into three portions, which each extend approximately 120°. Posts 228 are made as small as possible, consistent with ease of manufacturing, to maximize the circumferential extent of slit 224.

Referring now also to FIGS. 9 and 12–14, the diameter of cylindrical bottom 214 is slightly smaller than a vertical hole 230 extending through thermal reflector 102. A bottom surface 232 of cylindrical bottom 214 sits on top of a stand-off 234. Stand-off 234 has apertures that couple a purge gas flow from a horizontal channel 236 formed by a groove 237 in the bottom of reflector 102 and the top of central support 116. Horizontal channel 236 connects, in turn, to a conduit 238 extending through central support 116. The other end of conduit 238 outside chamber 200 can have a fitting 240 for connecting to a regulated supply of purge gas (not shown), or may be connected to the purge gas supply by other known methods. A resilient o-ring 242 provides a seal between the outer surface of injector bottom 214 and reflector 102.

Stand-off 234 has a ring-shaped body 244 that includes a central passage 246 that is approximately the same diameter as lower portion 218 of injector's 248 central channel 212. Four pie-shaped posts 250 are machined from the bottom side.

Purge gas flows from channel 236, through spaces between pie-shaped posts 250, up through the stand-off's central passage 246 and into central channel 212 of injector 248. Purge gas then flows up through injector 248 and out of slit 224 in a substantially radial direction. This produces a flow of purge gas that is substantially parallel to backside 107 of the spinning substrate 106 and directed approximately radially outward.

Slit 224 is oriented parallel to the substrate so that the flow of purge gas from central channel 212 of injector 248 does not have any straight, line-of-sight paths impacting directly on the substrate's backside 107. This arrangement inhibits the flow of purge gas from injector 248 from preferentially cooling any spots on substrate 106.

As described above with reference to other embodiments of the invention, the spinning substrate 106 draws the purge gas upward toward the substrate backside 107, and impels the purge gas in a outward spiralling direction. Although we have observed positive effects from spinning the substrate at rotational speeds as low as approximately 30–40 RPM, the rotational speed is determined largely by time constants in the thermal feedback system of the temperature controller 111. The substrate 106 should rotate at least one full turn during a cycle of the temperature controller. We have found that in the described system substrate 106 can be spun at approximately 75–120 RPM, although higher speeds can be used, and more advantageously substrate 106 is spun at approximately 85–95 RPM.

In the system described with reference to FIG. 9, injector 248 is the only source of purge gas in chamber 200. Upon reaching the periphery of cavity 118, the spiraling flow of purge gas curls downward along the inner surface of cylinder 136. Some of the purge gas may return towards injector along the top of cover 204 or in the space between cover 204 and reflector 102. However, to maintain a constant pressure in cavity 118, purge gas must exit cavity 118 with a flow equal to that being input from injector 248. This outward flow is directed mostly through an annular-shaped gap 254 between the stationary reflector 102 and the spinning cylinder 136. In the embodiment described with reference to FIG. 9, edge ring 132 does not include channels for the removal of the purge gas between its ledge and substrate 106, therefore very little purge gas escapes between edge ring 134 and substrate 106. Gap 254 may be, for example, approximately 0.1 inches (2.5 mm) wide. From there, the purge gas flows between bearing races 140, 142 and ball bearings 138, between spinning bearing race 142 and shield 154, along the outer surface of cylinder 136, and then between shield 154 and an edge ring extension 252, and out towards exhaust port 256. In the case where some of the purge gas leaks from cavity 118 to processing region 130 due to, e.g., imperfections in edge ring 134, these gases may also be pulled along co-rotating edge ring extension 252 and removed.

A similar system for removing purge gas from cavity 118 through an annular gap between cylinder 136 and reflector 102 can be used in a process chamber having a magnetically levitated rotation mechanism. Such a system is described in the aforementioned related application entitled "Magnetically-Levitated Rotor System For An RTP Chamber."

As mentioned above, injector 248 is located slightly away from the central axis 201 of the reflector plate 102 and thermal cavity 118. The precise location depends on design features of the system. Some of the considerations for optimum placement of injector 248 in a multiple lamp RTP system are the following. Since the presence of injector 248 perturbs the temperature profile of the wafer in the vicinity of where the injector is located, it is desirable to move injector 248 out towards the periphery of the spinning wafer.

In that way, its net impact on any single location of the wafer is reduced because the outer regions of the spinning wafer are heated by multiple lamps of heating element 110 and any given location near the periphery does not feel the impact of injector 248 except for a small part of the rotational cycle. However, as injector 248 is positioned farther out towards the periphery of the wafer, the flow of purge gas relative to backside 107 of the spinning wafer 106 becomes more asymmetric. To achieve a more symmetric flow, which is of course desirable, injector 248 should be closer to the center, where it produces a greater impact on the temperature profile. Thus, the optimum location is determined by balancing these two competing effects, and it will tend to be close to but not at the center. In the described embodiment, injector 248 is positioned approximately 20%–30% of the distance from central axis 201 to cylinder 136.

With regard to the height of injector 248, it is desirable to position slit 224 as close to backside 107 of the spinning wafer as possible so as to get effective flow of purge gas against the spinning wafer. However, if top 226 of injector 248 is too close to wafer 106, the region between top 226 of injector 248 and backside 107 of wafer 106 will tend to entrap gas or negatively impact the flow of purge gas in this region. Thus, the optimum height of injector 248 is determined by balancing these two competing effects.

In the described system for processing 300 mm wafers, the backside 107 of the wafer may be about 18 mm above the reflector plate 102. Injector 248 may be approximately 0.8 inches (20 mm) long. Injector top 216, including top plate 226, may be approximately 0.4 inches (10 mm) high and 0.75 inches (19 mm) in diameter. Injector bottom 214 may be approximately 0.4 inches (10 mm) long and 0.375 inches (9.5 mm) in diameter. Slit 224 may be about 15 mils (0.3 mm) wide and may be positioned about 7 mm above the reflector plate 102. Where the reflector cover 204 is used, slit 224 may be only slightly elevated above an upper surface of cover 204, for example, approximately 1–2 mm above cover 204. Slit may be located approximately 0.11 inches (3 mm) below the top of top plate 226. Lower channel 218 may be approximately 0.24 inches (6 mm) in diameter; upper channel may be approximately 0.51 inches (13 mm) in diameter.

The purge gas introduced into cavity 118 by injector 248 ensures that a continuous back-pressure is maintained so that deposition does not occur on backside 107 of substrate 106. For such a structure, an appropriate purge gas flow rate might be about 4–10 liters/min of $H_2$ with a back pressure at atmospheric pressure in cavity 118, depending of course on other process and system variables. Gas flow rates scale down approximately as the back-pressure is decreased. A suitable back-pressure may be about 100 milliTorr, although this pressure varies according to the process.

Although we have shown injectors 148 and 248 in RTP systems, it should be understood that they can also be used in any system in which the backside purge technique described herein would be useful.

In other embodiments, the purge gas can be introduced into cavity 118 trough multiple injection ports or injectors. The injection ports may direct the purge gas parallel to substrate 106, or at an angle towards substrate. Regardless of the manner in which the purge gas is introduced into cavity 118, the rotating substrate 106 provides a pumping action that will impel the purge gas to spiral radially outward along substrate backside 107.

Also note that the process and purge gases may be removed from the chamber through multiple exhaust ports, which may be distributed around the support structure.

Although the invention is especially useful in semiconductor fabrication processes in which the substrate is typically a disk-shaped semiconductor, we intend the term "substrate" to broadly cover any object that is being processed in a vapor process chamber. The term "substrate" includes, for example, semiconductor wafers, flat panel displays, glass plates or disks.

In addition, the term "vapor processing system" is intended to broadly cover any process by which a surface of a substrate is altered by flowing a process gas over the surface. This can include CVD systems, RTCVD systems, RTO systems, RTN systems, and other vapor processing systems that are currently known or that may be developed.

Figure 2:
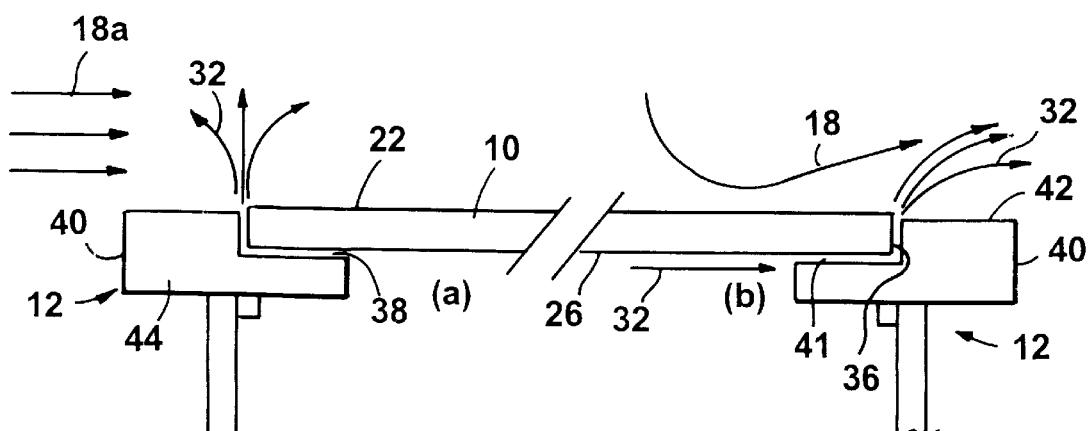
FIGS. 2(a) and (b) are partial diagrammatic cross-sectional side views of a substrate and support structure showing gas flow patterns (a) when there is no reaction gas flow and the substrate is not rotated, and (b) when a reaction gas is directed towards the front side of the substrate and the substrate is rotated.

Though we have described the system as including a front side gas injection system which uses a showerhead and produces radially symmetric gas flow, the invention also works in the case of side injection system which produces a gas flow as indicated by the arrows 18a in FIG. 2.

Other embodiments are within the scope of the invention.

What is claimed is:

1. A purge gas injector for a processing system that includes a process chamber, the purge gas injector comprising:

an injector body having a central axis and including an internal conduit and an exit orifice in fluid communication with the internal conduit, said exit orifice distributed around the circumference of the body and oriented to flow the purge gas supplied through the central conduit outward from the body in a range of substantially radial directions relative to the central axis.

2. The purge gas injector of claim 1, wherein said injector body further comprises;

a top plate; and a support structure holding said top plate spaced above said bottom element so as to form said orifice.

3. The purge gas injector of claim 2, wherein said injector body is made of quartz.

4. The purge gas injector of claim 2, wherein said bottom element has a cylindrically-shaped upper part of a first diameter and a cylindrically-shaped lower part of a second diameter that is smaller than first diameter and wherein said top plate has a diameter equal to the first diameter.

5. The purge gas injector of claim 1 wherein the exit orifice is formed by a slit substantially circumscribing the injector body in a plane that is perpendicular to the central axis.

6. A processing system comprising:

a process chamber;

a support assembly within said process chamber which supports a substrate during processing; and a purge gas injector positioned below a backside of said substrate when the substrate is supported by said support assembly, said purge gas injector including an injector body having a central axis and including an internal conduit and an exit orifice in fluid communication with internal conduit, said exit orifice distributed around the circumference of the body and oriented to flow a purge gas supplied through the central conduit outward from the body into the process chamber in a range of substantially radial directions relative to the central axis.

7. The processing system of claim 6, wherein said injector body further includes:
   a bottom element in which the central conduit is formed
   a top plate; and
   a support structure holding said top plate spaced above said bottom element so as to form said orifice.

8. The processing system of claim 7, wherein the lower end of the channel has a first diameter, and the upper end of the channel has a second diameter being larger than the first diameter.

9. The processing system of claim 7, wherein said injector body is made of quartz.

10. The processing system of claim 6, wherein said support assembly includes a quartz cylinder and an edge ring for supporting the substrate, said cylinder supporting said edge ring, wherein the processing system further comprises a reflector plate positioned in the process chamber and below the substrate when the substrate is supported by said support assembly, wherein a thermal cavity is formed by said reflector plate, said quartz cylinder, said edge ring and the backside of the substrate, and wherein said reflector plate includes an opening through which said purge gas injector protrudes into said thermal cavity so that the exit orifice is above to surface of the reflector plate.

11. The processing system of claim 10, wherein the processing system further comprises a quartz shield positioned between said reflector plate and a processing plane in which the substrate is held during processing, said quartz shield shielding the reflector plate and including an aperture through which said purge gas injector extends into a space between said shield and said processing plane.

12. The processing system of claim 10, wherein said quartz cylinder and said reflector plate provide a gap therebetween for the outflow of said purge gas from said thermal cavity.

13. The processing system of claim 10, further comprising:
   a heat source positioned above the substrate, when the substrate is supported by said support assembly, said heat source being suitable for thermal processing of the substrate.

14. The processing system of claim 6, wherein the injector is positioned off of a central axis of the substrate when the substrate is supported by said support assembly.

15. The processing system of claim 14, wherein the injector is positioned closer to the central axis than to a peripheral edge of the substrate, when the substrate is supported by said support assembly.

16. The processing system of claim 6, wherein said process chamber further includes a rotation mechanism to rotate said support assembly and the substrate about a central axis of the substrate while the purge gas is flowing from said purge gas injector, wherein said rotation mechanism rotates said support assembly at a rate sufficient to impel said flow of purge gas to flow spirally outward along the backside of the substrate.

17. The processing system of claim 16, wherein said rotation mechanism is capable of rotating said edge ring at a rate of at least about 30 RPM.

18. A method for processing a substrate, comprising:
   supporting a substrate within a process chamber such that a backside of the substrate is substantially exposed; and
   from a location that is adjacent the backside of the substrate, injecting a purge gas into the process chamber over a range of substantially radial outward directions relative to an axis that is substantially perpendicular to the backside of the substrate.

19. The method of claim 18, further comprising rotating the substrate while injecting the purge gas.

20. The method of claim 19, further comprising heating the substrate while rotating the substrate and injecting the purge gas.

21. The method of claim 19, further comprising flowing a process gas on a front side of the substrate while injecting the purge gas.

22. The method of claim 19 wherein the range of outward directions spans 360°.

23. The method of claim 19 wherein the step of supporting involves supporting the substrate above a plate so that the substantially exposed backside of the substrate is parallel to and directed towards the plate.

24. The method of claim 19 wherein the step of injecting involves injecting the purge gas substantially into a plane proximate to a top surface of the plate.

* * * * *